United States Patent
Henninger et al.

(10) Patent No.: US 6,690,062 B2
(45) Date of Patent: Feb. 10, 2004

(54) TRANSISTOR CONFIGURATION WITH A SHIELDING ELECTRODE OUTSIDE AN ACTIVE CELL ARRAY AND A REDUCED GATE-DRAIN CAPACITANCE

(75) Inventors: Ralf Henninger, München (DE); Franz Hirler, Isen (DE); Joachim Krumrey, München (DE); Walter Rieger, Arnoldstein (AT); Martin Poelzl, Ossiach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/391,997

(22) Filed: Mar. 19, 2003

(65) Prior Publication Data

US 2003/0178676 A1 Sep. 25, 2003

(51) Int. Cl.[7] ............................................. H01L 29/76
(52) U.S. Cl. ..................... 257/340; 257/386; 257/659
(58) Field of Search ............................. 257/340, 341, 257/386, 488, 630, 659

(56) References Cited

U.S. PATENT DOCUMENTS

| | | | |
|---|---|---|---|
| 5,283,201 A | 2/1994 | Tsang et al. | |
| 6,107,160 A | * 8/2000 | Hebert et al. | ............... 257/340 |
| 6,150,675 A | 11/2000 | Franke et al. | |

FOREIGN PATENT DOCUMENTS

WO     98/02925     1/1998

* cited by examiner

*Primary Examiner*—Mark V. Prenty
(74) *Attorney, Agent, or Firm*—Laurence A. Greenberg; Werner H. Stemer; Gregory L. Mayback

(57) ABSTRACT

The switching behavior of a transistor configuration is improved by providing a shielding electrode in an edge region. The shielding electrode surrounds at least sections of an active cell array. The capacitance between an edge gate structure and a drain zone and hence the gate-drain capacitance CGD of the transistor configuration is reduced by the shielding electrode located in the edge region.

20 Claims, 7 Drawing Sheets

TRANSISTOR CONFIGURATION WITH A SHIELDING ELECTRODE OUTSIDE AN ACTIVE CELL ARRAY AND A REDUCED GATE-DRAIN CAPACITANCE

BACKGROUND OF THE INVENTION

FIELD OF THE INVENTION

The invention relates to a transistor configuration having at least one active cell array, which is formed from at least one transistor cell configured in a substrate. The transistor configuration has an edge region that surrounds the active cell array at least in sections. The substrate has a substrate surface and a substrate rear side located opposite to the substrate surface, parallel to the substrate surface. The transistor cell has a gate electrode that is electrically insulated from the substrate by an insulator layer. The edge region has an electrically conductive edge gate structure connected to the gate electrode. A drain zone is provided in the substrate and is electrically conductively connected to a drain metallization of the transistor configuration.

In particular, the invention is beneficial in transistor configurations, such as trench MOS (Metal Oxide Semiconductor) power transistors, for instance, which make it possible to control switching currents with high current intensities (up to tens of amperes) by using control voltages in the region of a plurality of volts, in which case the dielectric strength in the switched load circuit may amount to as much as hundreds of volts and the switching times are usually less than one microsecond.

A trench MOS power transistor usually includes a semiconductor body having an active cell array and a passive edge region. A plurality of trench transistor cells are configured one beside another and are electrically connected in parallel in the active cell array.

Depending on the construction of the trench transistor cells, it is possible to realize, for example, normally on and normally off p-channel and n-channel trench MOS power transistors.

FIG. 2 is a simplified cross sectional view of an individual conventional trench transistor cell 3 of a normally off n-channel trench MOS power transistor 1. In this case, a semiconductor substrate of the trench MOS power transistor 1 includes a heavily n-doped (n++-doped) basic substrate, which forms a drain zone 16. Configured on the drain zone 16 is a weakly n-doped (n--doped) drift zone 24 that has emerged from an epitaxial method.

The drift zone 24 is adjoined by first, p-doped and second, n++-doped diffusion regions. In this case, the p-doped diffusion regions form channel zones 27 and the n++-doped diffusion regions form source zones 26 of the trench transistor cell 3. A trench 9 is provided in the diffusion regions. The inner surface of this trench 9 is lined with a gate oxide 25. The rest of the trench 9 is filled with conductive polysilicon which forms a gate electrode 10.

The gate electrode 10 is connected to a gate terminal and the source zones 26 are connected to a source terminal of the trench MOS power transistor. There is provided on the substrate surface 7 a field oxide layer 18, which electrically insulates the source zones 26 and the gate electrode 10 from applied metallizations. On a substrate rear side 8 located opposite to the substrate surface 7, a drain metallization 15 is configured adjoining the drain zone 16 of the semiconductor body.

In the zero-voltage state, the conductive source zones 26 are isolated from the drain zone 16 by the p-doped channel zones 27. If the gate electrode 10 is biased with a positive potential, then minority carriers, in this case electrons, accumulate in the channel zone 27, directly adjoining the gate oxide 25. As the positive bias of the gate electrode 10 rises, an n-conducting channel forms in the originally p-conducting channel zone 27 (inversion).

As the current intensity rises between the source zone and the drain zone, the temperature of the semiconductor body increases and the mobility of the charge carriers in the channel zone decreases. This effect means that trench transistor cells can be electrically connected in parallel in a simple manner. By way of example, if a somewhat higher current initially flows through one of the parallel-connected trench transistor cells in the switched-on state, then this leads to a greater temperature increase in this trench transistor cell. On account of the increased temperature, the mobility of the charge carriers in the channel is reduced and the trench transistor cell therefore acquires a higher resistance. Consequently, the current is distributed between cooler trench transistor cells connected in parallel.

In the semiconductor body of a trench MOS power transistor, a trench transistor cell usually includes an elongate trench. In the manner described above, it is possible, then, to arrange a plurality of these trenches one beside the other to form an active cell array.

The maximum current intensity which can be switched by a trench MOS power transistor is determined by the drain-source resistance (RDS(ON)) of the trench transistor cells connected in parallel. The minimum switching time or maximum operating frequency is essentially determined by the gate parameters of input resistance (RG) and input capacitance (CISS).

The input resistance is essentially determined by the resistance of the gate electrodes in the trenches. Added to this is a smaller proportion, resulting from the resistance of the connecting lines between a gate terminal of the trench MOS power transistor and the gate electrodes in the trenches. The input capacitance CISS results from adding the gate-source capacitance (CGS) and the gate-drain capacitance (CGD).

A configuration for trench transistor cells of the kind disclosed in FIG. 2 has a high capacitance between the gate electrodes 10 and the drift zone 24 assigned to the drain terminal. It results from the fact that the drift zone 24 and the gate electrodes 10 are located opposite one another at the thin gate oxide 25.

International Publication WO 98/02925 (Franke et al.) discloses a MOS power transistor having a gate electrode configured in a planar manner above the substrate surface. In this transistor, the switching times and switching losses are reduced because of a reduced gate-drain capacitance CGD. In this case, a field electrode connected to the source terminal of the MOS power transistor is respectively configured beside the gate electrode. The field electrode shields the electrical charge on the gate electrode from the drift zone and reduces the area at which the gate electrodes and the drift zone are located opposite one another.

Furthermore, U.S. Pat. No. 5,283,201 (Tsang et al.) discloses a trench MOS power transistor having a gate electrode configured in trenches in a semiconductor substrate. A further region made of the material of the gate electrode is configured below the gate electrode, and this region is electrically insulated from the gate electrode.

By means of concepts of the kind thus disclosed in U.S. Pat. No. 5,283,201 (Tsang et al.) for example, and also by means of a further miniaturization of the structures in the active cell array, it is possible to reduce the switching times and thus also the electrical switching losses that occur during the switching times in the active cell array of MOS power transistors.

Since the switching losses reduce the effectiveness of circuits having MOS power transistors, for instance motor controllers or voltage converters, there is generally a demand for MOS power transistors having further improved switching properties and further reduced switching losses.

SUMMARY OF THE INVENTION

It is accordingly an object of the invention to provide a transistor configuration which overcomes the above-mentioned disadvantages of the prior art apparatus of this general type.

In particular, it is object of the invention to provide a transistor configuration having a reduced gate-drain capacitance in order to obtain an improved switching behavior compared with conventional transistor configurations.

With the foregoing and other objects in view there is provided, in accordance with the invention, a transistor configuration including: a substrate; at least one active cell array including at least one transistor cell configured in the substrate; an edge region surrounding at least sections of the active cell array; an insulator layer; a drain zone configured in the substrate; and at least one shielding electrode. The substrate has a substrate surface and a substrate rear side located opposite the substrate surface. The transistor cell has a gate electrode electrically insulated from the substrate by the insulator layer. The edge region has an electrically conductive edge gate structure connected to the gate electrode. At least sections of the shielding electrode are configured between the edge gate structure and the drain zone.

In accordance with an added feature of the invention, a trench is formed in the substrate; the transistor cell is configured along the trench; and the gate electrode is configured in the trench.

In accordance with an additional feature of the invention, there is provided: a trench formed in the substrate; a further insulator layer; and a field electrode oriented toward the substrate rear side. The field electrode is configured in the trench and below the gate electrode. The field electrode is electrically insulated from the gate electrode and from the substrate by the insulator layer and the further insulator layer.

In accordance with another feature of the invention, the active cell array includes a plurality of transistor cells.

In accordance with a further feature of the invention, the plurality of transistor cells are configured in strip form.

In accordance with a further added feature of the invention, the plurality of transistor cells are configured in strip form and in parallel one beside another.

In accordance with a further additional feature of the invention, there is provided: a trench formed in the substrate; a further insulator layer; and a field electrode oriented toward the substrate rear side. The field electrode is configured in the trench and below the gate electrode. The field electrode is electrically insulated from the gate electrode and from the substrate by the insulator layer and the further insulator layer. The shielding electrode is electrically conductively connected to the field electrode.

In accordance with another added feature of the invention, a source metallization is electrically conductively connected to the shielding electrode.

In accordance with another additional feature of the invention, a control device is electrically conductively connected to the shielding electrode. The control device is for controlling a potential on the shielding electrode to counteract a crosstalk of signals between the edge gate structure and the drain zone.

In accordance with another further feature of the invention, the edge gate structure is embodied as a gate ring made of polysilicon that at least partly encloses the active cell array.

In accordance with yet an added feature of the invention, a plurality of insulator layers are provided. The shielding electrode is configured as a planar layer made of doped polysilicon located between the substrate surface and the edge gate structure. The plurality of insulator layers electrically insulate the shielding electrode from the substrate surface and the edge gate structure.

In accordance with yet an additional feature of the invention, a well is formed in the substrate below the edge gate structure. The shielding electrode is formed by that well. The edge region is a part of the substrate having a doping of a first conductivity type. The well has a doping of a conductivity type opposite the first conductivity type.

In accordance with yet another feature of the invention, a further insulator layer having a large layer thickness is configured between the edge gate structure and the shielding electrode. The further insulator layer minimizes a capacitance between the edge gate structure and the shielding electrode.

In accordance with yet a further feature of the invention, there is provided: a first metallization plane having a source metallization and a gate metallization; and a second metallization plane located between the substrate surface and the first metallization plane. The edge gate structure includes a material of a high conductivity in the second metallization plane.

In accordance with an added feature of the invention, a gate metallization forms the edge gate structure.

In accordance with an additional feature of the invention, the edge gate structure includes aluminum.

In accordance with another feature of the invention, a conductive drain-up structure is configured in the substrate; and a metallization is configured above the substrate surface. The conductive drain-up structure is electrically insulated from the substrate. The conductive drain-up structure electrically conductively connects the drain zone to the metallization configured above the substrate surface.

In accordance with a further feature of the invention, there is provided a drain metallization adjoining the drain zone. The drain zone is electrically conductively connected to the drain metallization.

In accordance with a further added feature of the invention, there is provided: a plurality of adjacent transistor cells having a plurality of trenches and a plurality of gate electrodes; and a plurality of transverse trenches configured between the plurality of trenches of the plurality of adjacent transistors cells. The plurality of transverse trenches electrically conductively connect the plurality of the gate electrodes of the plurality of adjacent transistors cells.

In accordance with a further additional feature of the invention, there is provided: a plurality of adjacent transistor cells having a plurality of trenches and a plurality of field electrodes; and a plurality of transverse trenches configured between the plurality of trenches of the plurality of adjacent transistors cells. The plurality of transverse trenches electrically conductively connect the plurality of the field electrodes of the plurality of adjacent transistors cells.

In the inventive transistor configuration, the gate-drain capacitance is reduced by a shielding electrode having at least in sections configured in an edge region surrounding an active cell array in each case between an edge gate structure and a drain zone.

The edge region functionally serves for contact-connecting the gate electrodes of the transistor cells and also, in more recent concepts, for contact-connecting the field electrodes. To that end, the transistor cells are lengthened beyond the active cell array. In order to minimize the nonreactive gate input resistance, the gate electrodes, which are usually formed from a heavily doped polysilicon, are enlarged in the edge region to form extensive edge gate structures and are connected to an applied gate metallization using a plurality of plated-through holes.

In this case, the extensive edge gate structure forms, in the edge regions, a first electrode of a planar gate-drain capacitance CISS(Edge), whose counterelectrode is formed by the drift zone. The gate-drain capacitance CISS(Edge) in the edge region is added to the gate-drain capacitance CISS (Array) of the transistor cells in the active cell array to give the total input capacitance CISS=CISS(Edge)+CISS(Array). The smaller the gate-drain capacitance of the active cell array, the larger the relative proportion of the total gate-drain capacitance of the transistor configuration that is made up by the gate-drain capacitance in the edge region. In the case of trench MOS power transistors optimized with regard to on-state losses, for instance, the edge proportion formed by the gate-drain capacitance of the edge region typically turns out to be small on account of the large area of the active cell array. However, since, in more recent concepts, the same drain-source resistance can be realized in the on state RDS(ON) even with significantly smaller active cell arrays, the switching behavior of such MOS power transistors is increasingly being influenced by the edge proportion of the gate-drain capacitance.

The proportion of the total gate-drain capacitance of the MOS power transistor, which is made up by the gate-drain capacitance of the edge region surrounding the active cell array and a further periphery of the MOS power transistor, is gaining in importance as a result.

A switching behavior of a power transistor is generally determined by the switching time, which identifies the time within which the drain-source path of the power transistor undergoes transition from the conducting to the blocking state, or vice versa. In this case, the switching time determines the operating frequency of the power transistor. On the other hand, the switching behavior of a power transistor is characterized by the switching losses which arise during the changeover operation in the semiconductor structure and have to be dissipated. In this case, the switching losses are in turn essentially determined by the switching times.

In this case, the switching time is determined by a time constant that is determined by the nonreactive input resistance of the gate electrode, and also by a charge QG on the gate electrode. The magnitude of the charge is dependent on a variable input capacitance CISS. The input capacitance CISS results from the gate-source capacitance and the gate-drain capacitance of the power transistor. Since, in more recent concepts for trench MOS power transistors, the gate-drain capacitance in an active cell array is greatly reduced by the configuration of a field electrode, the gate-drain capacitance of such trench MOS power transistors is also determined to a not inconsiderable extent by an edge capacitance configured between an edge gate structure configured in an edge region surrounding the active cell array and a drift zone in the semiconductor body of the trench MOS power transistor.

Although a simple reduction of the area of the edge gate structures leads, on the one hand, to a reduction of the input capacitance, it nevertheless leads, on the other hand, to an increase in the input resistance. If, instead of this, shielding electrodes are configured between the edge gate structures and the drain zone, then this leads to a reduction of the gate-drain capacitance in the edge region without increasing the nonreactive resistance of the lead to the gate electrodes at the same time.

This shielding electrode is electrically insulated both from the edge gate structures and from the drain zone or the substrate by insulator layers. In this case, each of the insulator layers can be realized as a single layer, for instance, as an oxide layer, or as a multilayer system.

The shielding electrode is advantageously connected to the field electrode in the active cell array, with the result that shielding is effected in the active cell array and in the edge region with an identical shielding potential.

In a particularly preferred embodiment of the transistor configuration, the shielding electrodes are electrically conductively connected, at least in part, together with the field electrodes and with a source metallization of a trench MOS power transistor. This results in the gate-drain capacitance of the edge region being converted into a gate-source capacitance and a source-drain capacitance. The influence thereof on the switching behavior of the trench MOS power transistor is significantly smaller than the influence of the gate-drain capacitance.

In a further preferred embodiment of the transistor configuration, the shielding electrode is electrically conductively connected to a control device. Such a control device controls a potential on the shielding electrode which supports the shielding or the switching operation. The control device may be provided in other regions of the semiconductor body of the transistor configuration. As an alternative to this, the shielding electrodes are connected to an additional electrical terminal of the transistor configuration, via which terminal, a suitable signal for optimizing the shielding behavior or switching behavior of the transistor configuration is fed in as required in an application-specific manner.

The transistor configuration advantageously has a gate ring made of heavily doped polysilicon, which at least partly encloses an active cell array. The gate ring serves as an edge gate structure above the substrate surface, and is electrically insulated from the latter by an insulation layer. A shielding electrode is situated below the gate ring. Both the nonreactive input resistance and the input capacitance are minimized by such a combination of gate ring and shielding electrode.

The shielding electrode is preferably configured as a planar layer made of doped polysilicon between a substrate surface and the edge gate structure. The edge gate structure and the shielding electrode are electrically insulated from one another by at least one insulator layer. Such a realization of the shielding electrode made of doped polysilicon on the substrate surface is particularly advantageous in terms of production technology because, for instance, in the case of customary trench MOS power transistors with field electrodes, such a planar layer made of polysilicon can be produced together with structures that are required for the contact-connection of the field electrodes.

In a further preferred embodiment of the transistor configuration, the shielding electrode is constructed by doping the substrate in a region situated below the edge gate structures. In this case, the region forming the shielding electrode has a doping of a conductivity type that is opposite the conductivity type of the doping of the surrounding substrate. In the edge region, the doping of the substrate of a trench MOS power transistor usually has the doping of the drift zone. This is a light n--type doping in the case of n-channel MOS power transistors. Accordingly, the region of the shielding electrode then has a p-type doping. Since, in the case of trench MOS power transistors, the drift zone is subjected to implantation steps anyway at least for the purpose of forming channel zones and source zones, the shielding electrode can be realized simply in this way without special additional outlay.

In a further preferred embodiment of the invention, edge gate structures made of polysilicon are greatly reduced in terms of their extent and instead of this, are embodied as gate structures in the metallization plane. Since the material of the metallization plane, for instance aluminum, has a lower resistivity than doped polysilicon, these structures can be provided with a smaller area for the same nonreactive resistance. Moreover, the metallization plane bears on an insulator layer, for instance an oxide layer, which is usually made very thick relative to the other layers for functional reasons.

The invention has been explained above in each case using the example of a trench transistor cell. The invention can furthermore be extended in an obvious manner to IGBTs (Insulated Gate Bipolar Transistors), transistor configurations with a planar structure, and those with a drain-up structure.

Other features which are considered as characteristic for the invention are set forth in the appended claims.

Although the invention is illustrated and described herein as embodied in a transistor configuration with a shielding electrode outside an active cell array and a reduced gate-drain capacitance, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
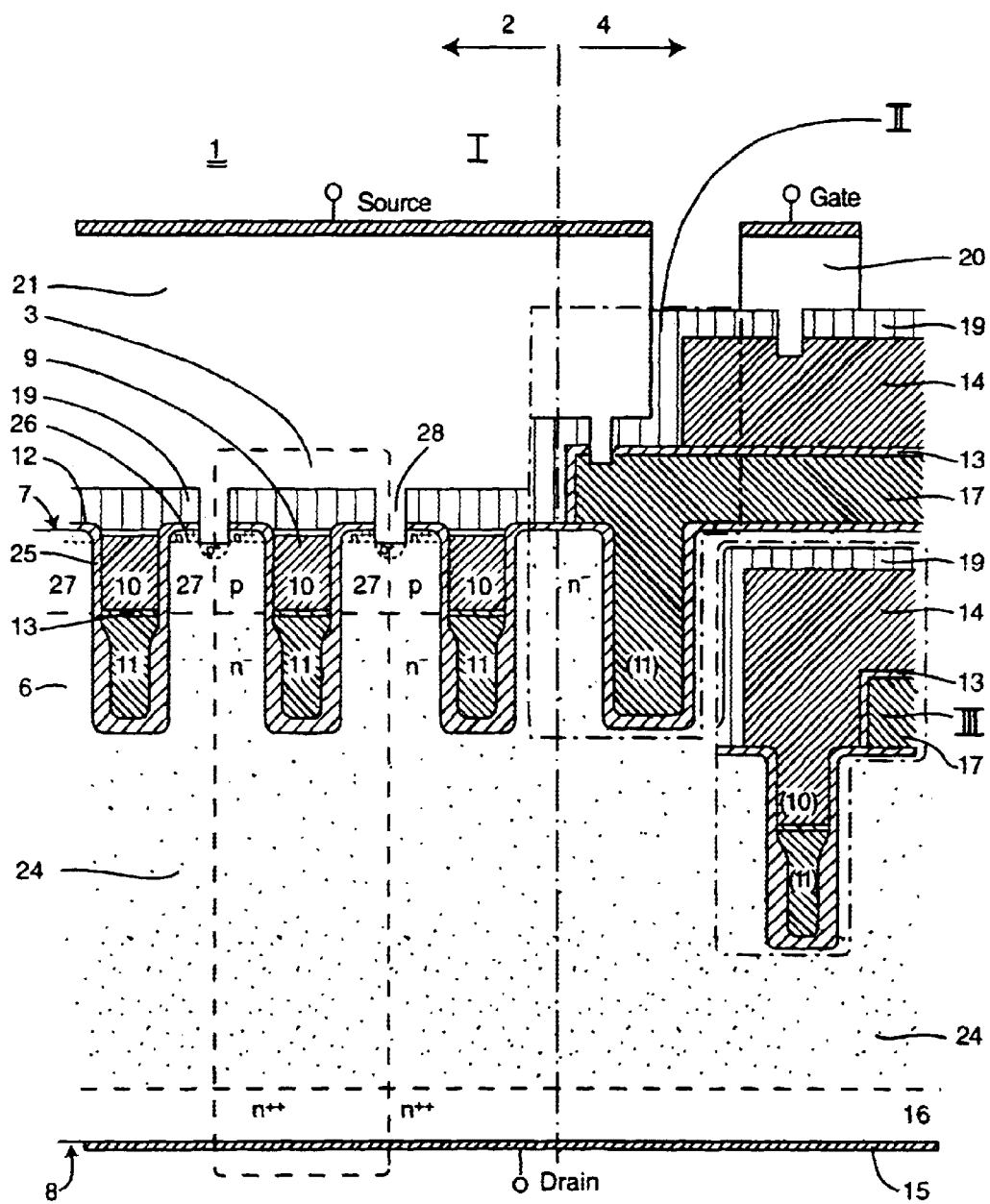
FIG. 1 is a simplified diagrammatic cross sectional view taken through a first exemplary embodiment of a transistor configuration showing the transition region between the active cell array and the edge region.
Figure 2:
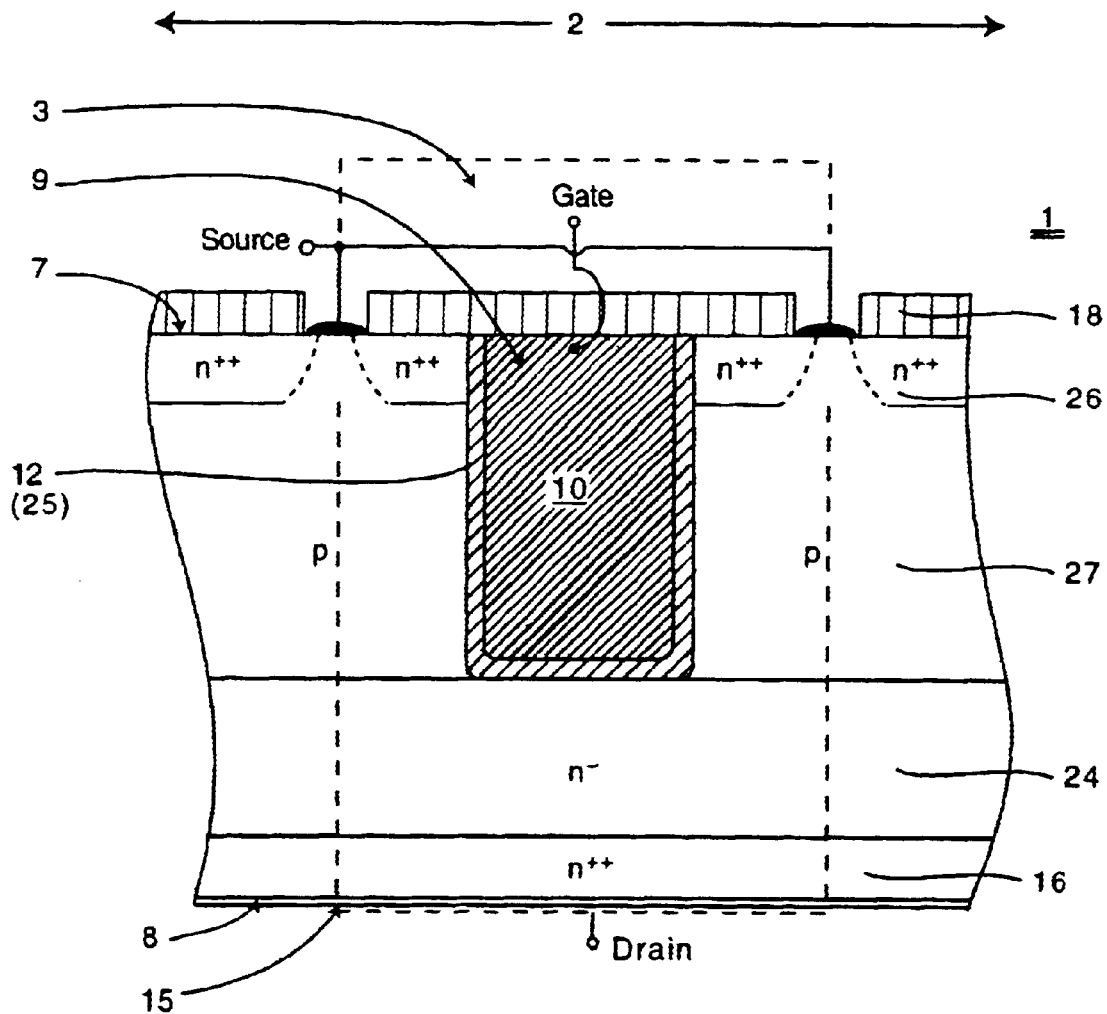
FIG. 2 is a diagrammatic, greatly simplified cross sectional view taken through a prior art trench transistor cell.

Referring now to the figures of the drawing in detail and first, particularly, to FIG. 1 thereof, there is diagrammatically shown a transistor configuration 1 embodied as a trench MOS power transistor with source, drain and gate terminals. The trench MOS power transistor is embodied as an n-channel MOSFET with a vertical double-diffused trench structure (VDMOSFET, vertical double-diffused metal oxide semiconductor field effect transistor). In this case, a drain metallization 15 is connected to the drain terminal and is configured on a substrate rear side 8 of a substrate 6. In the substrate, an n++-doped drain zone 16 adjoins the drain metallization 15. Opposite to the drain metallization 15, the drain zone 16 is adjoined by a drift zone 24. A space charge zone forms in the drift zone 24 during off-state operation of the trench MOS power transistor. The extent of this space charge zone essentially determines the maximum reverse voltage of the trench MOS power transistor. It has a weak n-type doping in comparison with the drain zone 16.

In an active cell array 2, trenches 9 are configured in the substrate 6. The trenches 9, which are illustrated in cross section, extend parallel in a direction perpendicular to the cross-sectional area in this example. The trenches 9 are lined with a first insulator layer 12, by which gate electrodes 10 and field electrodes 11 configured within the trenches 9 are electrically insulated from the substrate. The gate electrodes 10 and the field electrodes 11 are electrically insulated from one another by a second insulator layer 13. In regions between the trenches 9, the drift zone 24 of the substrate 6 is adjoined by channel zones 27 located approximately opposite the gate electrodes 10. Source zones 26 are provided between the channel zones 27 and the substrate surface 7. The field electrodes 11 reduce the capacitance between the gate electrodes 10 and the drift zone 24. A source metallization 21 is electrically conductively connected to the source zones 26 by using plated-through holes 28. The source metallization 21 is electrically insulated from the gate electrodes 10 by an intermediate oxide layer 19. The material both of the gate electrodes 10 and of the field electrodes 11 is heavily doped polysilicon, for example. The conductivity of the gate electrode 10 can be improved for example by providing an additional layer in the gate electrode 10, for instance a silicide layer. The trench 9 with a gate electrode 10 and the field electrode 11 forms, together with the adjoining doped regions of the substrate 6, a trench transistor cell 3 extending as far as the drain zone 16.

If a positive potential is applied to the gate electrode 10 in such an active transistor cell 3, then in the p-doped channel zone 27 located opposite the gate electrode 10 at the insulator layer 12 in the region of the gate oxide 25, an n-conducting inversion channel forms from the minority carriers (electrons) of the p-doped channel zone 27 that have accumulated there.

In an edge region 4 of the trench MOS power transistor 1, first, the field electrodes 11 configured in the trenches 9 are contact-connected to the source metallization 21. Second, the gate electrodes 10 configured in the trenches 9 are contact-connected to a gate metallization 20. Furthermore, the edge region 4 illustrated represents an exemplary embodiment of a shielding electrode 17.

The field electrodes 11 configured in the trenches 9 are contact-connected for example in a cross-sectional plane II, which is configured in a vertical direction parallel to the first cross-sectional plane I. In the trenches 9, which run perpendicularly to the cross-sectional plane I, the gate electrodes 10 do not extend over the entire length of the trenches 9, so that, in a termination region of the trenches 9, the respective field electrode 11 is contact-connected in the manner shown in the plane II. Each field electrode 11 drawn over the substrate surface 7 is electrically conductively connected to the source metallization 21. A shielding electrode 17 extending above the substrate surface 7 is additionally formed.

In a further cross-sectional plane III, which extends between the first cross-sectional plane I and the second cross-sectional plane II parallel to the latter, the gate electrodes 10 are electrically connected to an edge gate structure 14. The edge gate structure 14 is electrically conductively connected to the gate metallization 20. In this example, the gate edge structures 14 and the shielding electrodes 17 are formed from doped polysilicon. The source metallization 21, the gate metallization 20, the gate edge structure 14, the shielding electrode 17, and also the substrate 6 are electrically insulated from one another in each case by a first insulator layer 18 (field oxide layer), a second insulator layer 19 (intermediate oxide layer) and also a further insulator layer 13.

In this example, the gate-drain capacitance of the trench MOS power transistor 1 is reduced by the field electrodes 11 in the active cell array 2 to an extent such that the switching behavior of the trench MOS power transistor 1 is additionally significantly improved through the provision of the shielding electrode 17, between the drain zones 16, 24 and the edge gate structure 14 in the edge region 4 of the trench MOS power transistor 1.

Figure 3:
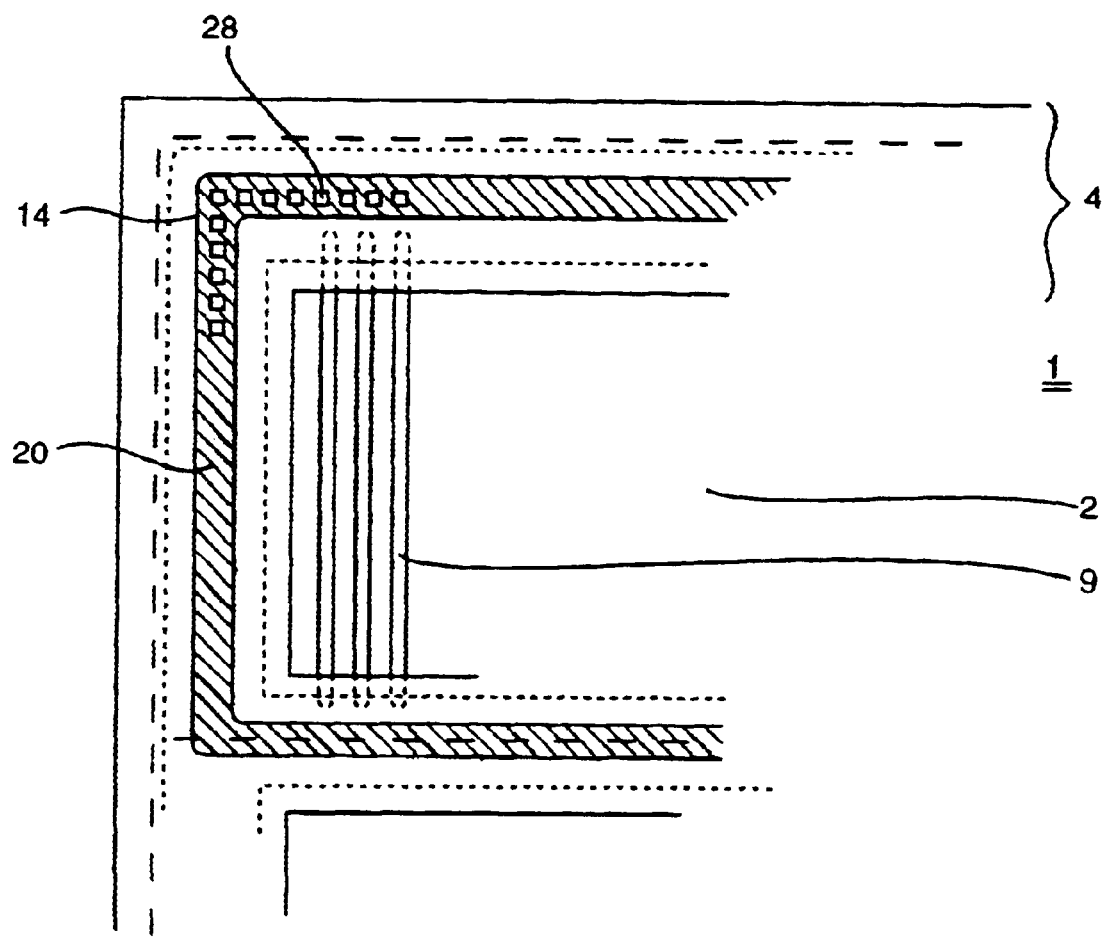
FIG. 3 is a diagrammatic, simplified plan view of a portion of a trench MOS power transistor.

FIG. 3 is a plan view of a simplified diagrammatically illustrated portion of the surface of a trench MOS power transistor 1. In this case, the trench MOS power transistor 1 has at least one active cell array 2, each of which is surrounded by edge regions 4. The cell array 2 has trench transistor cells 3 with trenches 9 configured one beside the other in the active cell array 2. The trenches 9 are lengthened into the edge region 4 or connected by dedicated connection strips in which the gate electrodes 10 and field electrodes 11 configured in the trenches 9 are respectively contact-connected. In order to minimize the nonreactive resistance in the lead to the gate electrodes 10, the edge region 4 in this case has an edge gate structure 14 made of doped polysilicon. An electrically conductive connection is provided between the edge gate structure 14 and the gate electrodes 10 configured in the trenches 9. Using plated-through holes 28, a gate metallization 20 configured on the surface of the trench MOS power transistor 1 is electrically conductively connected to the edge gate structure, which is isolated from the metallization by at least one insulator layer.

Figure 4:
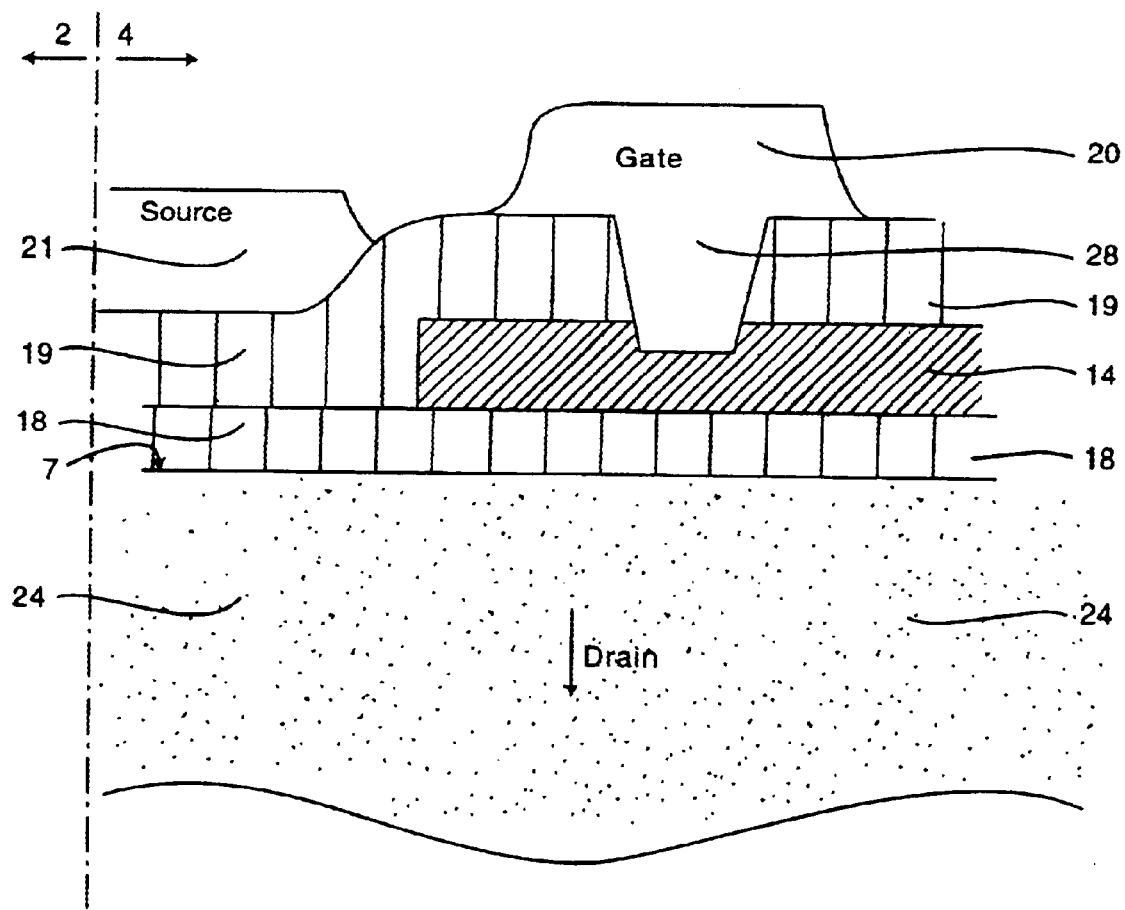
FIG. 4 is a diagrammatic cross sectional view taken through a section of an edge region of a conventional transistor configuration.

FIG. 4 is a diagrammatic cross sectional view taken through a portion of an edge region 4 of a conventional transistor configuration. In this case, a field oxide layer 18 is configured above a drift zone 24 and electrically insulates the drift zone 24 from the edge gate structure 14 bearing in sections on the field oxide layer 18. A further insulator layer 19 (intermediate oxide layer) insulates the edge gate structure 14 from further conductive layers, for instance a source metallization 21. The gate metallization 20 is electrically conductively connected to the underlying edge gate structure 14, which is usually formed from doped polysilicon, by means of plated-through holes 28.

The gate edge structure 14 forms, by way of the intervening field oxide layer 18 and the underlying drift zone 24, a capacitance CGD which adversely affects the switching behavior of the transistor configuration.

Figure 5:
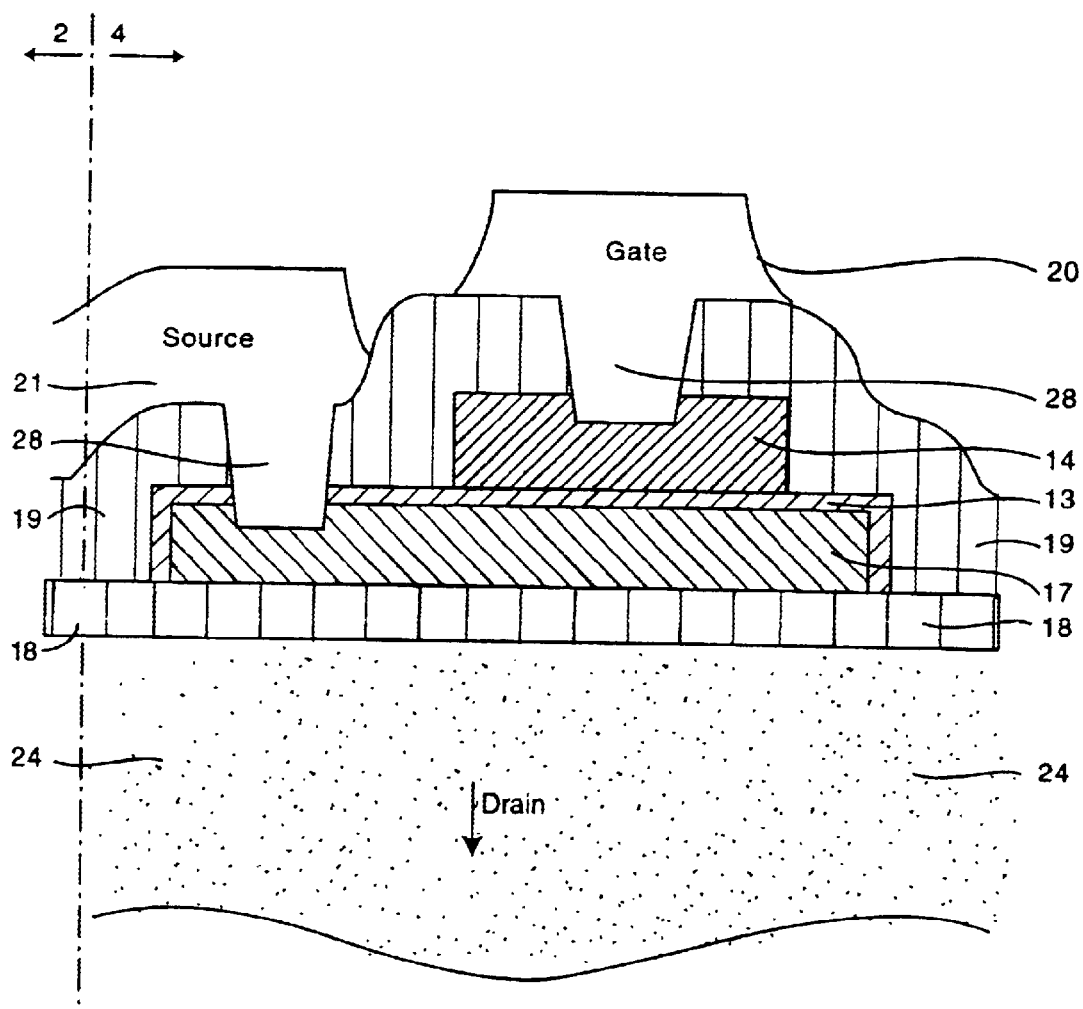
FIG. 5 is a diagrammatic cross sectional view taken through an edge region of a second exemplary embodiment of the transistor configuration.

FIG. 5 shows an edge region 4 of a second exemplary embodiment of a transistor configuration embodied as a trench MOS power transistor. In contrast to the configuration illustrated from FIG. 4, a shielding electrode 17 is provided in sections on a field oxide layer 18 bearing on a drift zone 24. The shielding electrode is electrically conductively connected to a source metallization 21. An edge gate structure 14 is isolated from the shielding electrode 17 by an insulator layer 13. The edge gate structure 14 is electrically conductively connected to a gate metallization 20 via plated-through holes 28. In this configuration, the shielding electrode 17 transforms the capacitance between the edge gate structure 14 and the drift zone 24 into a capacitance between the edge gate structure 14 and the shielding electrode 17, that is to say into a capacitance between the gate terminal and the source terminal. This capacitance influences the switching behavior of the trench MOS power transistor considerably less than the capacitance between the gate terminal and the drain terminal.

Figure 6:
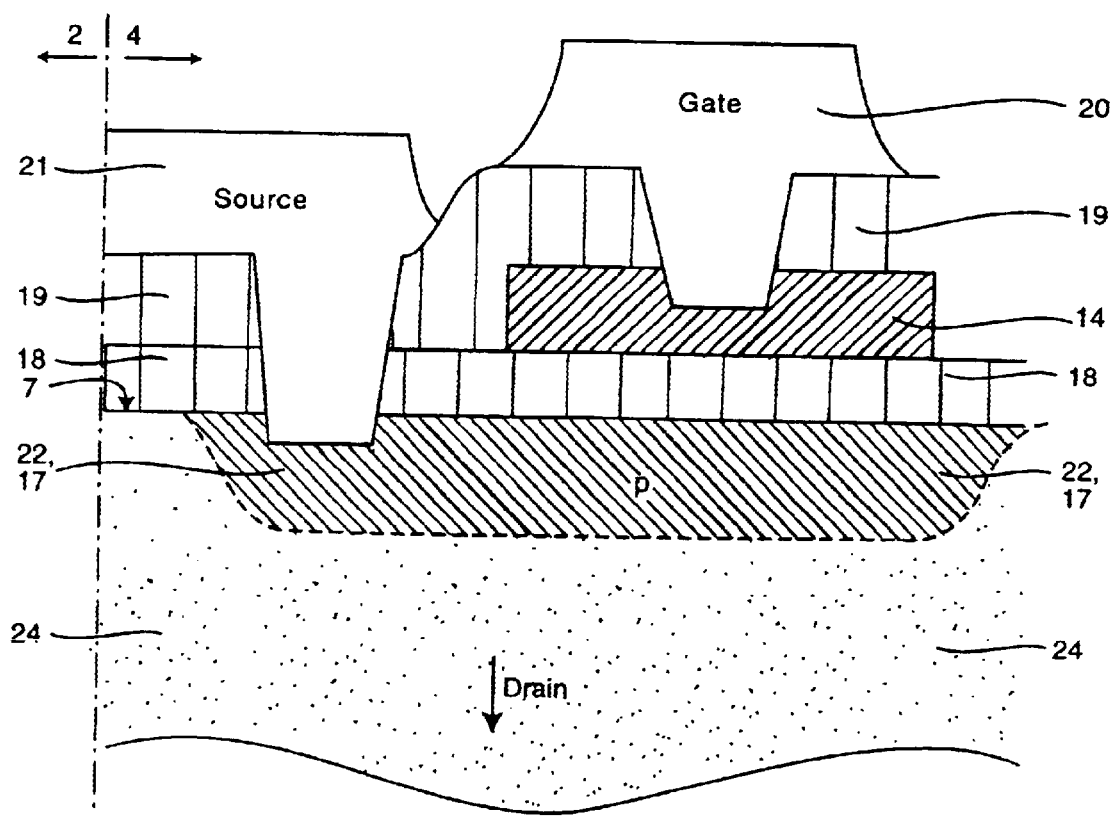
FIG. 6 is a diagrammatic cross sectional view taken through an edge region of a third exemplary embodiment of the transistor configuration.

FIG. 6 illustrates the edge region 4 of a third exemplary embodiment of a transistor configuration embodied as a trench MOS power transistor in which a shielding electrode 17, 22 is provided. In this case, the shielding electrode 17, 22 is realized as a p-doped region below the substrate surface 7 in the drift zone 24, which is n--doped in this example.

Figure 7:
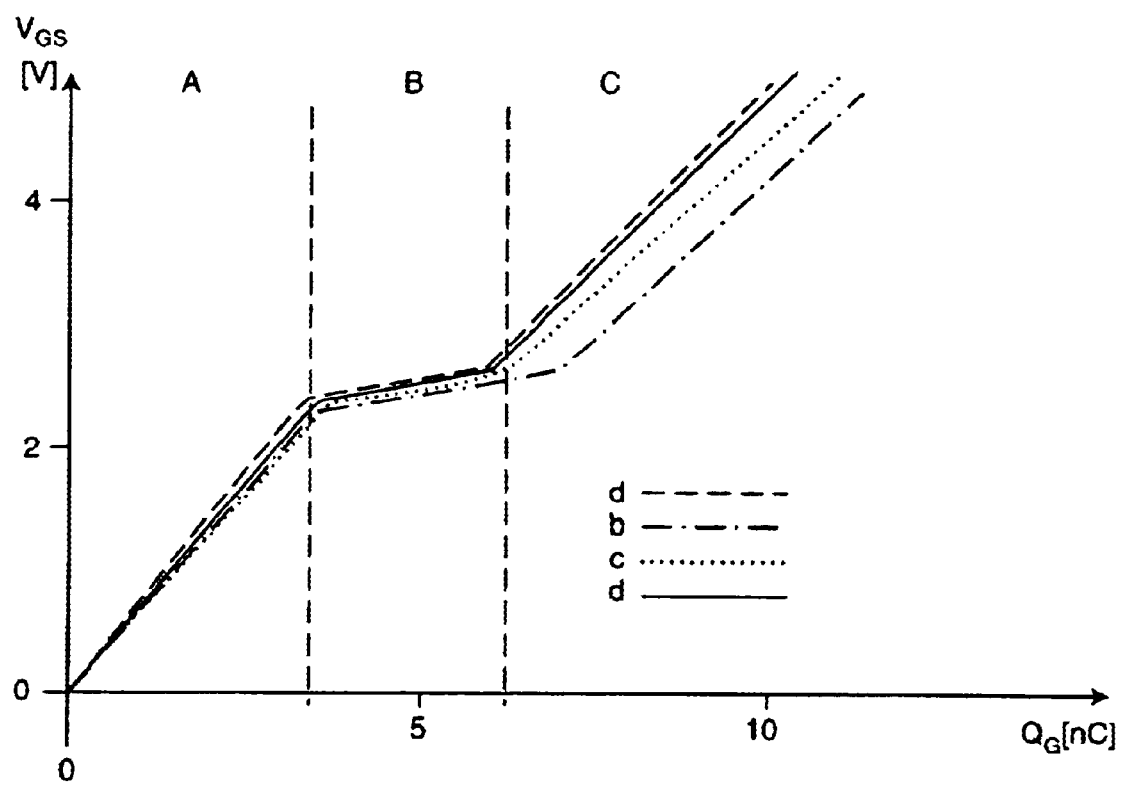
FIG. 7 is a family of characteristic curves showing the gate-source voltage UGS versus the gate charge QG.

FIG. 7 is a graph of a family of characteristic curves of the gate-source potential UGS versus the gate charge QG for different instances of the edge regions of trench MOS power transistors. If, proceeding from an uncharged gate electrode, the charge of the gate electrode is increased by a constant charging current, then the potential between the gate and the source rises virtually linearly in a first region A.

In a second region B, a further increase in charge leads only to a very small change in the potential difference between the gate and the source. In this region, a further driving of the source-drain path of the trench MOS power transistor is initially delayed. The flat characteristic-curve section in region B is referred to as the Miller plateau, the length of which is a measure of a duration of the switching operation of a MOS transistor.

In a third region C, the relationship between the charge on the gate electrode and the potential between the gate and the source is virtually linear again. The markedness (length) of the Miller plateau is dependent on the magnitude of the gate-drain capacitance. The larger the gate-drain capacitance, the more marked (longer) the Miller plateau, and the more additional charge has to be applied to the gate electrode.

The characteristic curve "a" describes the behavior of an idealized trench MOS power transistor which exclusively has an active cell array without an edge region and in whose trench transistor cells, field electrodes are configured.

The characteristic curve "b" represents the behavior of a conventional trench MOS power transistor having an edge gate structure that is electrically insulated from the substrate by a field oxide layer.

The characteristic curve "c" identifies the behavior of the first exemplary embodiment of a trench MOS power transistor in which a shielding electrode made of polysilicon is configured between the edge gate structure and the substrate.

Finally, the characteristic curve "d" describes the relationship between the gate-source potential and the gate charge for a trench MOS power transistor in which the edge gate structure is reduced to a gate metallization. In this case, the gate metallization is electrically insulated from a shielding electrode by an intermediate oxide layer and the shielding electrode is electrically insulated from the substrate by a field oxide layer.

We claim:

1. A transistor configuration, comprising:
   a substrate;
   at least one active cell array including at least one transistor cell configured in said substrate;
   an edge region surrounding at least sections of said active cell array;
   an insulator layer;
   a drain zone configured in said substrate; and
   at least one shielding electrode;
   said substrate having a substrate surface and a substrate rear side located opposite said substrate surface;
   said transistor cell having a gate electrode electrically insulated from said substrate by said insulator layer;
   said edge region having an electrically conductive edge gate structure connected to said gate electrode; and
   at least sections of said shielding electrode configured between said edge gate structure and said drain zone.

2. The transistor configuration according to claim 1, further comprising: a trench formed in said substrate; said transistor cell configured along said trench; and said gate electrode configured in said trench.

3. The transistor configuration according to claim 1, further comprising:
   a trench formed in said substrate;
   a further insulator layer; and
   a field electrode oriented toward said substrate rear side;
   said field electrode configured in said trench and below said gate electrode; and
   said field electrode electrically insulated from said gate electrode and from said substrate by said insulator layer and said further insulator layer.

4. The transistor configuration according claim 1, wherein said active cell array includes a plurality of transistor cells.

5. The transistor configuration according claim 4, wherein said plurality of transistor cells are configured in strip form.

6. The transistor configuration according to claim 4, wherein said plurality of transistor cells are configured in strip form and in parallel one beside another.

7. The transistor configuration according to claim 1, further comprising:
   a trench formed in said substrate;
   a further insulator layer; and
   a field electrode oriented toward said substrate rear side;
   said field electrode configured in said trench and below said gate electrode;
   said field electrode electrically insulated from said gate electrode and from said substrate by said insulator layer and said further insulator layer;
   said shielding electrode electrically conductively connected to said field electrode.

8. The transistor configuration according to claim 1, further comprising a source metallization electrically conductively connected to said shielding electrode.

9. The transistor configuration according to claim 1, further comprising:
   a control device electrically conductively connected to said shielding electrode;
   said control device for controlling a potential on said shielding electrode for counteracting a crosstalk of signals between said edge gate structure and said drain zone.

10. The transistor configuration according to claim 1, wherein said edge gate structure is embodied as a gate ring made of polysilicon that at least partly encloses said active cell array.

11. The transistor configuration according to claim 1, further comprising:
    a plurality of insulator layers;
    said shielding electrode configured as a planar layer made of doped polysilicon located between said substrate surface and said edge gate structure; and
    said plurality of insulator layers electrically insulating said shielding electrode from said substrate surface and said edge gate structure.

12. The transistor configuration according to claim 1, further comprising:
    a well formed in said substrate below said edge gate structure;
    said shielding electrode being formed by said well;
    said edge region being a part of said substrate having a doping of a first conductivity type; and
    said well having a doping of a conductivity type opposite the first conductivity type.

13. The transistor configuration according to claim 1, further comprising:
    a further insulator layer having a large layer thickness configured between said edge gate structure and said shielding electrode; and
    said further insulator layer minimizing a capacitance between said edge gate structure and said shielding electrode.

14. The transistor configuration according to claim 1, further comprising:
    a first metallization plane having a source metallization and a gate metallization; and
    a second metallization plane located between said substrate surface and said first metallization plane;
    said edge gate structure including a material of a high conductivity in said second metallization plane.

15. The transistor configuration according to claim 1, further comprising a gate metallization forming said edge gate structure.

16. The transistor configuration according to claim 1, wherein said edge gate structure includes aluminum.

17. The transistor configuration according to claim 1, further comprising:
    a conductive drain-up structure configured in said substrate; and
    a metallization configured above said substrate surface;
    said conductive drain-up structure being electrically insulated from said substrate;
    said conductive drain-up structure electrically conductively connecting said drain zone to said metallization configured above said substrate surface.

18. The transistor configuration according to claim 1, further comprising:
    a drain metallization adjoining said drain zone;
    said drain zone being electrically conductively connected to said drain metallization.

19. The transistor configuration according to claim 1, further comprising:
    a plurality of adjacent transistor cells having a plurality of trenches and a plurality of gate electrodes;
    a plurality of transverse trenches configured between said plurality of trenches of said plurality of adjacent transistors cells;
    said plurality of transverse trenches electrically conductively connecting said plurality of said gate electrodes of said plurality of adjacent transistors cells.

20. The transistor configuration according to claim 1, further comprising:
  a plurality of adjacent transistor cells having a plurality of trenches and a plurality of field electrodes;
  a plurality of transverse trenches configured between said plurality of trenches of said plurality of adjacent transistors cells;
  said plurality of transverse trenches electrically conductively connecting said plurality of said field electrodes of said plurality of adjacent transistors cells.

* * * * *

UNITED STATES PATENT AND TRADEMARK OFFICE
CERTIFICATE OF CORRECTION

PATENT NO. : 6,690,062 B2
DATED : February 10, 2004
INVENTOR(S) : Ralf Henninger et al.

It is certified that error appears in the above-identified patent and that said Letters Patent is hereby corrected as shown below:

<u>Title page,</u>
Insert item:
-- [30]  Foreign Application Priority Data
Mar. 19, 2002   [DE]         ………. 102 12 149.4 --

Signed and Sealed this

Sixth Day of April, 2004

JON W. DUDAS
*Acting Director of the United States Patent and Trademark Office*